United States Patent [19]
Kurz

[11] Patent Number: 4,810,973
[45] Date of Patent: Mar. 7, 1989

[54] METHOD OF COMPENSATING THE OFFSET VOLTAGE IN A VARIABLE GAIN AMPLIFIER AND CIRCUITRY FOR CARRYING OUT THE METHOD

[75] Inventor: Arthur Kurz, Karlsbad-Langensteinbach, Fed. Rep. of Germany

[73] Assignee: Deutsche Thomson-Brandt GmbH, Villingen-Schwenningen, Fed. Rep. of Germany

[21] Appl. No.: 117,070

[22] PCT Filed: Jan. 30, 1987

[86] PCT No.: PCT/EP87/00041
§ 371 Date: Oct. 9, 1987
§ 102(e) Date: Oct. 9, 1987

[87] PCT Pub. No.: WO87/05171
PCT Pub. Date: Aug. 27, 1987

[30] Foreign Application Priority Data

Feb. 21, 1986 [DE] Fed. Rep. of Germany ....... 3605561

[51] Int. Cl.[4] .......................... H03G 3/20; H03F 1/02
[52] U.S. Cl. ........................................ 330/129; 330/9
[58] Field of Search ............. 330/129, 278, 279, 282, 330/149, 9

[56] References Cited

U.S. PATENT DOCUMENTS 4,229,703 10/1980 Bustin ................................ 328/162
4,494,551 1/1985 Little, III et al. ................. 330/85

OTHER PUBLICATIONS

Kash, R., "Building Quality Analog Circuits with C-MOS Logic Arrays", Electronics, Aug. 11, 1981.

*Primary Examiner*—Gene Wan
*Attorney, Agent, or Firm*—Max Fogiel

[57] ABSTRACT

According to the disclosed method for the compensation of the offset voltage of a regulating amplifier (RV), the output of the regulating amplifier (RV) is separated from the regulating unit (SJ) of the regulating circuit. The value of the measured offset compensation voltage is stored. Once the offset compensation voltage has been measured and recorded, the output of the regulating amplifier (RV) is again connected to the regulating unit (SG) of the regulating circuit. The stored offset compensation voltage is applied to the input of the regulating amplifier (RV). Said method is used for example in the focus regulating circuit of a DC record player. Each time the compact-type record player is switched off and switched on again, the offset compensation voltage is again measured, stored and reapplied to the input of the regulating amplifier (RV).

7 Claims, 2 Drawing Sheets

METHOD OF COMPENSATING THE OFFSET VOLTAGE IN A VARIABLE GAIN AMPLIFIER AND CIRCUITRY FOR CARRYING OUT THE METHOD

BACKGROUND OF THE INVENTION

The invention concerns a method of compensating the offset voltage in a variable-gain amplifier.

Variable-gain amplifiers are employed for example in focus-and tracking-control loops in the optical scanning systems of compact-disk players. The wanted signals—audio or video signals stored in circular or spiral tracks on the disk for example—employed in compact-disk players are read out with an optical system. The optical system consists as a rule of a system of lenses that are axially displaced by the focus-control loop in such a way that the focus of the lens system rests against the disk. This method of control, which is basically similar to adjusting the image in a telescope, is called focussing. To allow the optical system to read the wanted signals off the disk satisfactorily it is necessary for the focus-control loop to be constantly adjusting the focus. Since even slight deviations in sharpness can lead to errors in reading the wanted signals stored on the disk, the variable-gain amplifier offset voltage cannot be too high, and it must accordingly be compensated.

SUMMARY OF THE INVENTION

The object of the invention is accordingly a method of compensating the offset voltage of a variable-gain amplifier.

This object is attained in accordance with the invention in that, in order to measure the offset-compensation voltage, the output terminal of the variable-gain amplifier is disconnected from the control-loop controls, in that the level of offset-compensation voltage is stored, in that, once the level of offset-compensation voltage has been detected and stored, the output terminal is reconnected to the control-loop controls, and in that the stored offset-compensation voltage is applied to the input terminal of the variable-gain amplifier.

DESCRIPTION OF THE PREFERRED EMBODIMENTS

The method in accordance with the invention will now be described with reference to the circuitry illustrated in FIG. 1.

Figure 1:
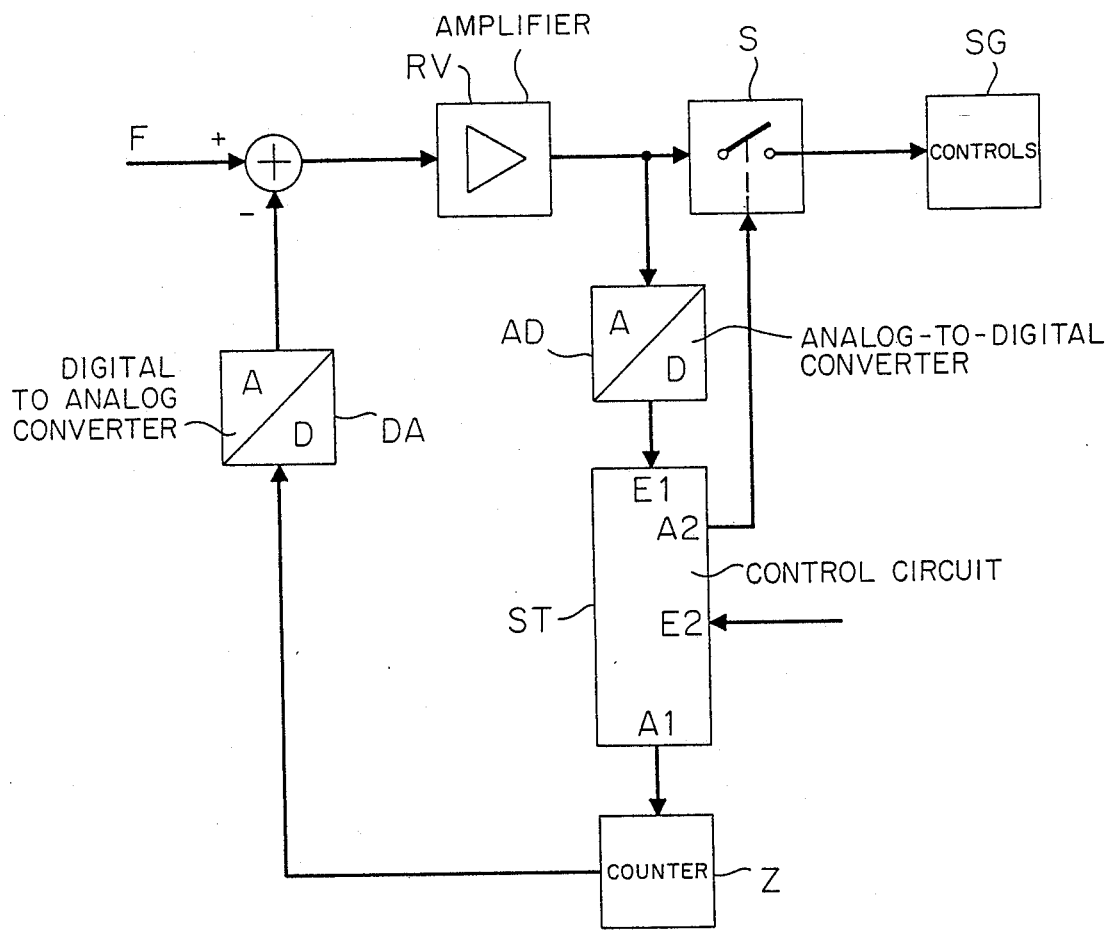
FIGS. 1 and 2 are diagrams of the circuitry employed to carry out the method in accordance with the invention.

The output terminal of the variable-gain amplifier RV illustrated in FIG. 1 is connected to the input terminal of an analog-to-digital converter AD and to one contact of a variable switch S, the other contact of which is connected to controls SG. The signal F that governs controls SG is at the input terminal of variable-gain amplifier RV. The output terminal of analog-to-digital converter AD is connected to one input terminal E1 of a control circuit ST. One output terminal A1 of control circuit ST is connected to the input terminal of an up-and-down counter Z, the output terminal of which is connected to the input terminal of a digital-to-analog converter DA. The output terminal of digital-to-analog converter DA is feedbacked to the input terminal of variable-gain amplifier RV. The offset reference voltage is applied to another input terminal E2 of control circuit ST. Another output terminal A2 of control circuit ST is connected to the control input terminal of variable switch S.

The operation of the circuitry that is illustrated in FIG. 1 and that can be installed in a compact-disk player for example will now be described.

When the compact-disk player is turned on, control circuit ST opens variable switch S and hence the focus-control loop. While the focus-control loop is open, the analog offset voltage at the output terminal of variable-gain amplifier RV is supplied in digital form through analog-to-digital converter AD to control circuit ST, wherein the offset voltage is compared with the offset reference voltage, which is usually zero. Control circuit ST releases counting pulses to up-and-down counter Z as long as the offset voltage at the output terminal of variable-gain amplifier RV does not equal the zero offset reference voltage. The count at the output terminal of counter Z is converted into an analog voltage in digital-to-analog converter DA. The analog voltage is feedbacked to the input terminal of variable-gain amplifier RV, compensating the offset voltage because up-and-down counter Z continues to receive counting pulses from control circuit ST until the offset voltage becomes zero. Once the offset voltage at the output terminal of variable-gain amplifier RV has been compensated, control circuit ST closes variable switch S, so that the focus-control loop will close again and so that the focus of the system of lenses will fall on the disk again.

Furthermore, since control circuit ST will from now on stop releasing counting pulses to up-and-down counter Z, the level of compensation voltage will be stored therein. The compensation voltage will be stored therein. The compensation voltage will be constantly applied in analog form to the input terminal of variable-gain amplifier RV through digital-to-analog converter DA. When the compact-disk player is turned off and then on again, variable switch S will open again as described in the foregoing, and the compensation voltage will be determined, stored, and supplied in analog form to the input terminal of variable-gain amplifier RV.

Figure 2:
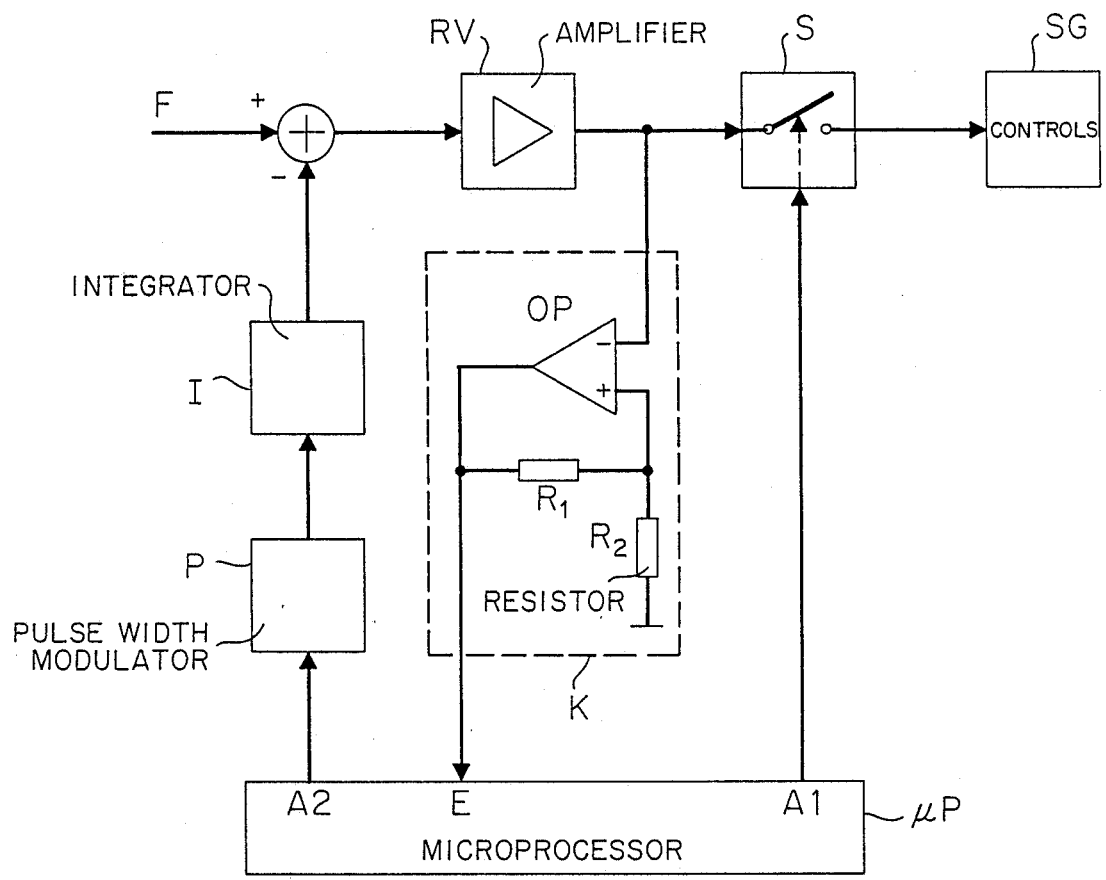

FIG. 2 illustrates another type of circuitry for carrying out the method in accordance with the invention.

The signal F that governs controls SG is at the input terminal of variable-gain amplifier RV. The output terminal of variable-gain amplifier RV is connected to the inverting input terminal of an operational amplifier OP and to one contact of a variable switch S, the other contact of which is connected to the input terminal of controls SG. The output terminal of operational amplifier OP is connected to to the input terminal E of a microprocessor $\mu$uP and, through a resistor R1, to its non-inverting input terminal, which is supplied with reference potential through another resistor R2. One output terminal A1 of microprocessor $\mu$uP is connected to the control input terminal of variable switch S. Another output terminal A2 of microprocessor $\mu$uP is connected to the input terminal of a pulse-width modulator P, the output terminal of which is connected to the input terminal of an integrator I. The output terminal of integrator I is connected to the input terminal of variable-gain amplifier RV.

How the circuitry illustrated in Figure works will now be described.

As in the circuitry illustrated in FIG. 1, turning on the equipment opens the focus-control loop when microprocessor μuP opens variable switch S with a signal that it releases from its first output terminal A1. Operational amplifier OP constitutes in conjunction with first and second resistors R1 and R2 a comparator K, which compares the offset voltage with the offset reference voltage. Microprocessor μuP varies the voltage at its second output terminal A2 until the offset voltage at the output terminal of variable-gain amplifier RV equals the offset reference voltage, meaning that the offset voltage has been compensated. The voltage level that compensates the offset voltage at the output terminal of variable-gain amplifier RV is now stored in microprocessor μuP. The first output terminal A1 of microprocessor μuP also releases a signal that closes variable switch S and hence the focus-control loop again. The compensation voltage is now constantly supplied to the input terminal of variable-gain amplifier RV through pulse-width modulator P and integrator I. The offset voltage will be compensated, as in the circuitry illustrated in FIG. 1, every time the equipment is turned on again.

Pulse-width modulator P can be integrated into microprocessor μuP or embodied in software employed therein.

One advantage of the invention is that it is no longer necessary to compensate the variable-gain amplifier when compact-disk players with a focus-control loop that operate by the method in accordance with the invention are manufactured. Because the offset voltage is recompensated every time the equipment is turned on, long-term drifts in the offset voltage that derive from aging of the components will have no effect. It will accordingly no longer be necessary for the focus-control loop variable-gain amplifier in a compact-disk player that originally works well but deteriorates in sound quality after a while to be recompensated in the shop. That maintenance of this type can be avoided in equipment with a control loop that operates in accordance with the invention must be considered another advantage in that maintenance is both annoying and expensive for the consumer.

I claim:

1. A method for compensating the offset voltage in a variable-gain amplifier having an input and output, comprising the steps: providing a regulating circuit with positioning means; disconnecting the output of said variable-gain amplifier from said positioning means of said regulating circuit for determining the offset compensating voltage; measuring the offset voltage; comparing said measured offset voltage with a reference value; obtaining the offset compensating voltage from said comparing step; storing said offset compensating voltage and feeding said offset compensating voltage to the input of said variable-gain amplifier; and reconnecting the output of said variable-gain amplifier with said positioning means of said regulating circuit.

2. A circuit arrangement for compensating the offset voltage in a variable-gain amplifier, comprising: a variable-gain amplifier having an input and an output; a regulating circuit with positioning means; means for disconnecting the output of said variable-gain amplifier from said positioning means of said regulating circuit for determining the offset compensating voltage; means for measuring the offset voltage; means for comparing said measured offset voltage with a reference value; means for obtaining the offset compensating voltage from said comparing means; means for storing said offset compensating voltage and feeding said offset compensating voltage to said input of said variable-gain amplifier; means for reconnecting the output of said variable-gain amplifier with said positioning means of said regulating circuit; means for applying a signal to the input of said variable-gain amplifier for controlling said positioning means; analog-to-digital converter means with input connected to the output of said variable-gain amplifier; variable switch means having one contact connected to said output of said variable-gain amplifier; said variable switch means having another contact connected to said positioning means; a control circuit with input connected to an output of said analog-to-digital converter means; and up-and-down counter with input connected to an output of said control circuit; said counter having an output connected to the input of said digital-to-analog converter means; said input of said variable-gain amplifier being connected to the output of said digital-to-analog converter means; said control circuit having another input connected to said reference voltage; said control circuit having another output connected to a control input of said variable switch means.

3. A circuit arrangement as defined in claim 2, wherein said digital-to-analog converter means comprises a series circuit of a pulse-width modulator and an integrator.

4. A circuit arrangement for compensating the offset voltage in a variable-gain amplifier, comprising: a regulating circuit with positioning means; a variable-gain amplifier having an input and an output; means for disconnecting the output of said variable-gain amplifier from said positioning means of said regulating circuit for determining the offset compensating voltage; means for measuring the offset voltage; means for comparing said measured offset voltage with a reference value; means for obtaining the offset compensating voltage from said comparing means; means for storing said offset compensating voltage and feeding said offset compensating voltage to the input of said variable-gain amplifier; means for reconnecting the output of said variable-gain amplifier with said positioning means of said regulating circuit; means for applying a signal to the input of said variable-gain amplifier for controlling said positioning means; an operational amplifier with inverting input connected to the output of said variable-gain amplifier; variable switch means having one contact connected to the output of said variable-gain amplifier; said variable switch means having another contact connected to an input said positioning means; a microprocessor with an input connected to an output of said operational amplifier; the output of said operational amplifier being connected through a resistor to a non-inverting input of said operational amplifier; said reference value being supplied to said non-inverting input through another resistor; said microprocessor having an output connected to a control input of said variable switch means; a pulse modulator having an input connected to another output of said microprocessor; an integrator having an input connected to an output of said pulse modulator; said integrator having an output connected to the input of said variable-gain amplifier.

5. A circuit arrangement as defined in claim 4, wherein said pulse modulator comprises a pulse-width modulator.

6. a circuit arrangement as defined in claim 4, wherein said pulse modulator is integrated with said microprocessor.

7. A circuit arrangement as defined in claim 4, wherein said pulse modulator is a part of the microprocessor software.

* * * * *